(12) United States Patent
Yeh et al.

(10) Patent No.: US 11,791,407 B2
(45) Date of Patent: Oct. 17, 2023

(54) SEMICONDUCTOR TRANSISTOR STRUCTURE WITH REDUCED CONTACT RESISTANCE AND FABRICATION METHOD THEREOF

(71) Applicant: UNITED MICROELECTRONICS CORP., Hsin-Chu (TW)

(72) Inventors: Chih-Tung Yeh, Taoyuan (TW); Chun-Liang Hou, Hsinchu County (TW); Wen-Jung Liao, Hsinchu (TW); Ruey-Chyr Lee, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 275 days.

(21) Appl. No.: 17/330,420

(22) Filed: May 26, 2021

(65) Prior Publication Data

US 2022/0367694 A1 Nov. 17, 2022

(30) Foreign Application Priority Data

May 11, 2021 (CN) .......................... 202110509466.4

(51) Int. Cl.
*H01L 29/40* (2006.01)
*H01L 29/778* (2006.01)
(Continued)

(52) U.S. Cl.
CPC ...... *H01L 29/7783* (2013.01); *H01L 29/2003* (2013.01); *H01L 29/205* (2013.01);
(Continued)

(58) Field of Classification Search
CPC ............. H01L 29/7783; H01L 29/2003; H01L 29/205; H01L 29/401; H01L 29/454; H01L 29/66462
See application file for complete search history.

(56) References Cited

U.S. PATENT DOCUMENTS

| 8,202,794 B2 * | 6/2012 | Mita .................. H01L 29/41725 438/576 |
| 2009/0146186 A1 * | 6/2009 | Kub .................. H01L 29/42316 257/E29.315 |

(Continued)

OTHER PUBLICATIONS

Jena, "Polarization induced electron populations in III-V nitride semiconductors Transport, growth, and device applications", Mar. 2003.

(Continued)

*Primary Examiner* — Jay C Chang
*Assistant Examiner* — Siangluai Mang
(74) *Attorney, Agent, or Firm* — Winston Hsu

(57) ABSTRACT

A semiconductor transistor structure with reduced contact resistance includes a substrate, a channel layer on the substrate, a barrier layer on the channel layer, a two-dimensional electron gas (2DEG) layer at an interface between the barrier layer and the channel layer, and a recess in a contact region. The recess penetrates through the barrier layer and extends into the channel layer. An Ohmic contact metal is disposed in the recess. The Ohmic contact metal is in direct contact with a vertical side surface of the barrier layer in the recess and in direct contact with an inclined side surface of the 2DEG layer and the channel layer in the recess.

17 Claims, 4 Drawing Sheets

(51) Int. Cl.
*H01L 29/66* (2006.01)
*H01L 29/205* (2006.01)
*H01L 29/45* (2006.01)
*H01L 29/20* (2006.01)

(52) U.S. Cl.
CPC .......... *H01L 29/401* (2013.01); *H01L 29/454* (2013.01); *H01L 29/66462* (2013.01)

(56) References Cited

U.S. PATENT DOCUMENTS

| | | | | |
|---|---|---|---|---|
| 2010/0140660 | A1* | 6/2010 | Wu | H01L 29/2003 257/E29.338 |
| 2015/0364330 | A1* | 12/2015 | Chen | H01L 29/2003 438/285 |
| 2016/0064539 | A1* | 3/2016 | Lu | H01L 29/4175 438/666 |
| 2017/0018617 | A1* | 1/2017 | Xia | H01L 29/7786 |
| 2019/0096879 | A1* | 3/2019 | Chen | H01L 27/0629 |
| 2019/0103483 | A1* | 4/2019 | Ahn | H01L 29/42356 |
| 2021/0336021 | A1* | 10/2021 | Lichtenwalner | H01L 29/7397 |

OTHER PUBLICATIONS

Guo, "MBE-Regrown Ohmics in InAlN HEMTs With a Regrowth Interface Resistance of 0.05 Ω· mm", IEEE Electron Device Letters, vol. 33, No. 4, Apr. 2012.

Joglekar, "Impact of recess etching and surface treatments on ohmic contacts regrown by molecular-beam epitaxy for AlGaN/GaN high electron mobility transistors", Appl. Phys. Lett. 109, 041602 (2016), S. Joglekar, M. Azize, M. Beeler, E. Monroy, and T. Palacios.

Lin, "A versatile low-resistance ohmic contact process with ohmic recess and lowtemperature annealing for GaN HEMTs", Semicond. Sci. Technol. 33 (2018) 095019.

* cited by examiner

SEMICONDUCTOR TRANSISTOR STRUCTURE WITH REDUCED CONTACT RESISTANCE AND FABRICATION METHOD THEREOF

BACKGROUND OF THE INVENTION

1. Field of the Invention

The present invention relates to the field of semiconductor technology, in particular to a semiconductor transistor structure with lower contact resistance.

2. Description of the Prior Art

GaN, AlN, InN, which are nitride semiconductors, or materials made of mixed crystals thereof, have a wide band gap, and are used as high output electronic devices or short-wavelength light emitting devices. Among these, as high output devices, technologies are developed in relation to field-effect transistors (FET), more particularly, High Electron Mobility Transistors (HEMT). A HEMT using such a nitride semiconductor is capable of realizing high current, high voltage, and low on resistance operations, and is thus used for high output/high efficiency amplifiers and high power switching devices.

In a GaN-based HEMT (GaN-HEMT), an AlGaN/GaN-HEMT which uses GaN as an electron transit layer and AlGaN as an electron supply layer has received attention. In the AlGaN/GaN-HEMT, distortion occurs in AlGaN, which originates in the difference between the lattice constants of GaN and AlGaN. A high concentration of two-dimensional electron gas (2DEG) is obtained due to the piezo polarization generated by the distortion and the spontaneous polarization of AlGaN.

For the power consumption and heating of components, on-resistance (Ron) is a very critical factor. The on-resistance may be the sum of the drain contact resistance, the drain resistance, the source contact resistance, the source resistance, and the channel resistance. As the size of the device shrinks, the ratio of the contact resistance (Rc) to the overall on-resistance also increases, which affects the operating efficiency of the device. In this technical field, there is still a need for an improved semiconductor transistor structure, which has a lower contact resistance and can maintain a high 2DEG density.

SUMMARY OF THE INVENTION

It is one object of the present invention to provide a semiconductor transistor structure and a manufacturing method thereof to solve the above-mentioned drawbacks or shortcomings of the prior art.

One aspect of the invention provides a semiconductor transistor structure with reduced contact resistance including a substrate; a channel layer on the substrate; a barrier layer on the channel layer; a two-dimensional electron gas (2DEG) layer at an interface between the barrier layer and the channel layer; a recess in a contact region penetrating through the barrier layer and extending into the channel layer; and an Ohmic contact metal disposed in the recess. The Ohmic contact metal is in direct contact with a vertical side surface of the barrier layer in the recess and in direct contact with an inclined side surface of the 2DEG layer and the channel layer in the recess.

According to some embodiments, the inclined side surface is inclined at an angle ranging between 60-80 degrees with a horizontal plane.

According to some embodiments, the channel layer comprises a GaN layer.

According to some embodiments, the barrier layer comprises an AlGaN layer.

According to some embodiments, the barrier layer further comprises an AlN layer.

According to some embodiments, the semiconductor transistor structure further includes a passivation layer on the barrier layer.

According to some embodiments, a depth of the recess is about 10 nm below a bottom surface of the barrier layer.

According to some embodiments, the Ohmic contact metal comprises Ti and Al.

Another aspect of the invention provides a semiconductor transistor structure with reduced contact resistance including a substrate; a channel layer on the substrate; a barrier layer on the channel layer; a two-dimensional electron gas (2DEG) layer at an interface between the barrier layer and the channel layer; a recess in a contact region penetrating through the barrier layer and extending into the channel layer; and an Ohmic contact metal disposed in the recess. The Ohmic contact metal is in direct contact with a vertical side surface of the barrier layer and the 2DEG layer in the recess and in direct contact with an inclined side surface of the channel layer in the recess.

According to some embodiments, the inclined side surface is inclined at an angle ranging between 60-80 degrees with a horizontal plane.

According to some embodiments, the channel layer comprises a GaN layer.

According to some embodiments, the barrier layer comprises an AlGaN layer.

According to some embodiments, the barrier layer further comprises an AlN layer.

According to some embodiments, the semiconductor transistor structure further includes a passivation layer on the barrier layer.

According to some embodiments, a depth of the recess is about 10 nm below a bottom surface of the barrier layer.

According to some embodiments, the Ohmic contact metal comprises Ti and Al.

Still another aspect of the invention provides a method of forming a semiconductor transistor structure with reduced contact resistance. A substrate is provided. A channel layer is formed on the substrate. A barrier layer is formed on the channel layer, thereby forming a two-dimensional electron gas (2DEG) layer at an interface between the barrier layer and the channel layer. A recess is formed in a contact region. The recess penetrates through the barrier layer and extends into the channel layer. The recess has a vertical sidewall profile in the barrier layer and an angled sidewall profile in the channel layer. An Ohmic contact metal is formed in the recess. The Ohmic contact metal is in direct contact with the barrier layer, the 2DEG layer and the channel layer in the recess.

According to some embodiments, the angled sidewall profile in the channel layer comprises an inclined side surface that is inclined at an angle ranging between 60-80 degrees with a horizontal plane.

According to some embodiments, the angled sidewall profile is also formed in the 2DEG layer.

According to some embodiments, the vertical sidewall profile is also formed in the 2DEG layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
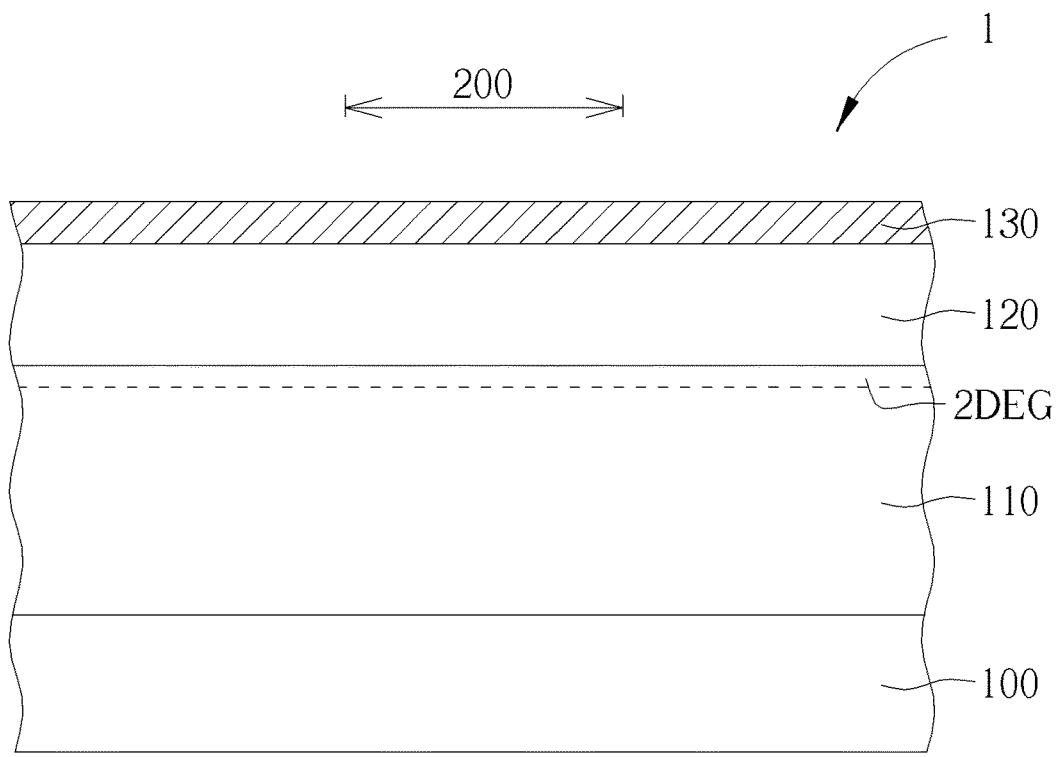
FIG. 1 to FIG. 4 are schematic diagrams of a method for forming a semiconductor transistor structure with reduced contact resistance according to an embodiment of the present invention.

Please refer to FIG. 1 to FIG. 4, which are schematic diagrams of a method for forming a semiconductor transistor structure 1 with a reduced contact resistance according to an embodiment of the present invention. First, as shown in FIG. 1, a substrate 100 is provided, for example, a sapphire, silicon carbide (SiC), gallium nitride (GaN) or silicon (Si) substrate, but it is not limited thereto. A channel layer 110 is then formed on the substrate 100 in an epitaxial manner. For example, the channel layer 110 may include a gallium nitride (GaN) layer, but is not limited thereto. A barrier layer 120, such as an aluminum gallium nitride (AlGaN) layer, is then formed on the channel layer 110 in an epitaxial manner, thereby forming two dimensional electron gas layer 2DEG at an interface between the barrier layer 120 and the channel layer 110. A passivation layer 130 may be formed on the barrier layer 120. The passivation layer 130 may comprise silicon nitride or silicon oxide, but it is not limited thereto. The substrate 100 comprises a contact region 200 for forming a contact electrode.

Figure 5:
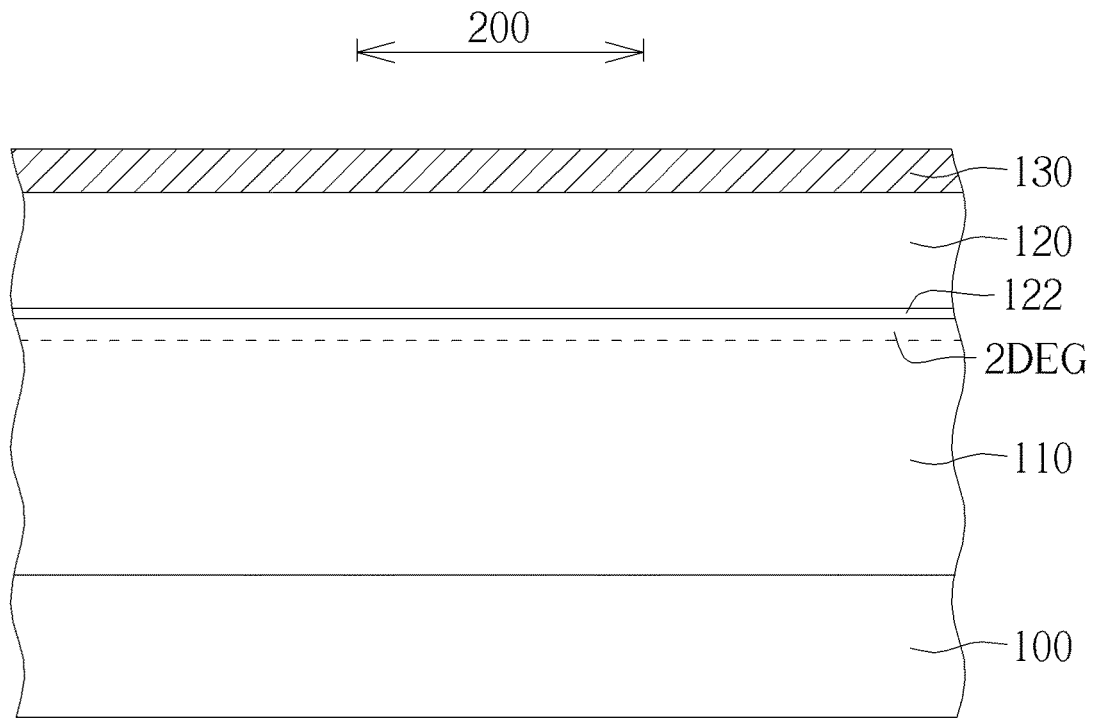
FIG. 5 shows a semiconductor structure according to another embodiment of the invention.

The present invention is not limited to the above-mentioned stacked structure. For example, according to other embodiments of the present invention, as shown in FIG. 5, the barrier layer 120 may further include an aluminum nitride (AlN) layer 122 directly on the channel layer 110.

Figure 2:
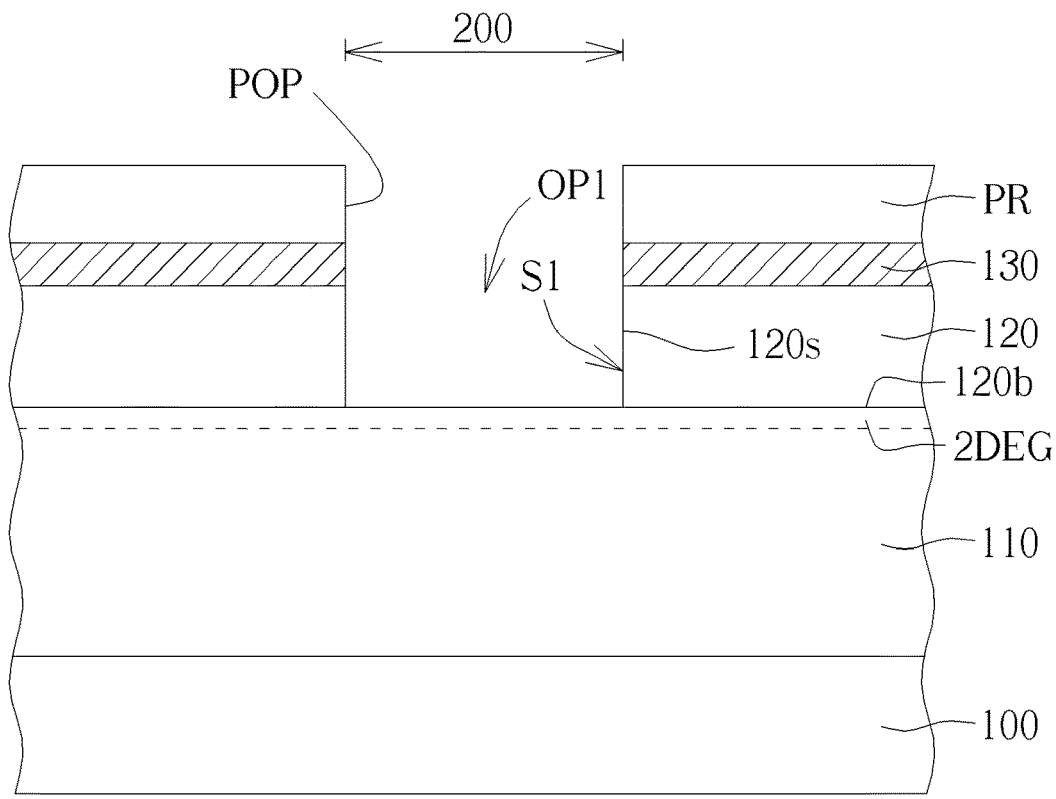

As shown in FIG. 2, a photoresist pattern PR is formed on the passivation layer 130 by using a lithography process. The photoresist pattern PR has an opening POP that exposes the contact region 200. An anisotropic dry etching process is then performed to etch the passivation layer 130 and the barrier layer 120 through the opening POP, thereby forming a first opening OP1 in the passivation layer 130 and the barrier layer 120 within the contact region 200. The first opening OP1 penetrates through the barrier layer 120, but the above etching process is controlled to stop at the surface of the channel layer 110. At this point, the first opening OP1 exposes the vertical side surface 120s of the barrier layer 120.

Figure 3:
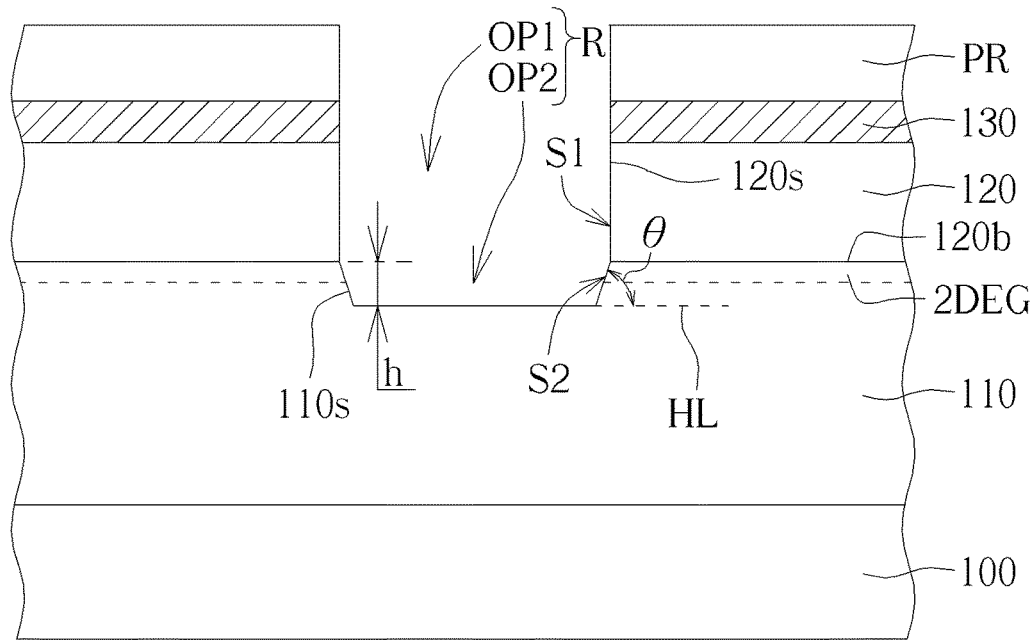

As shown in FIG. 3, another etching process is then performed to etch the channel layer 110 downwardly through the first opening OP1 to a predetermined depth h below the bottom surface 120b of the barrier layer 120. For example, the predetermined depth h may be about 10 nm, but not limited thereto. A tapered second opening OP2 is formed in this way. The first opening OP1 and the tapered second opening OP2 form a recess R. The recess R penetrates through the barrier layer 120 and extends into the channel layer 110. In the recess R, the vertical side surface 120s of the barrier layer 120 constitutes a vertical sidewall profile S1 and the inclined side surface 110s of the channel layer 110 constitutes an angled sidewall profile S2.

According to an embodiment of the present invention, for example, the inclined side surface 110s of the channel layer 110 is inclined at an angle θ ranging from 60 degrees to 80 degrees, preferably, at an angle θ ranging from 65 degrees to 75 degrees, to a horizontal plane HL. Forming the inclined side surface 110s of the channel layer 110 at the angle θ between 60 degrees and 80 degrees can ensure the smallest dangling bond density.

Figure 4:
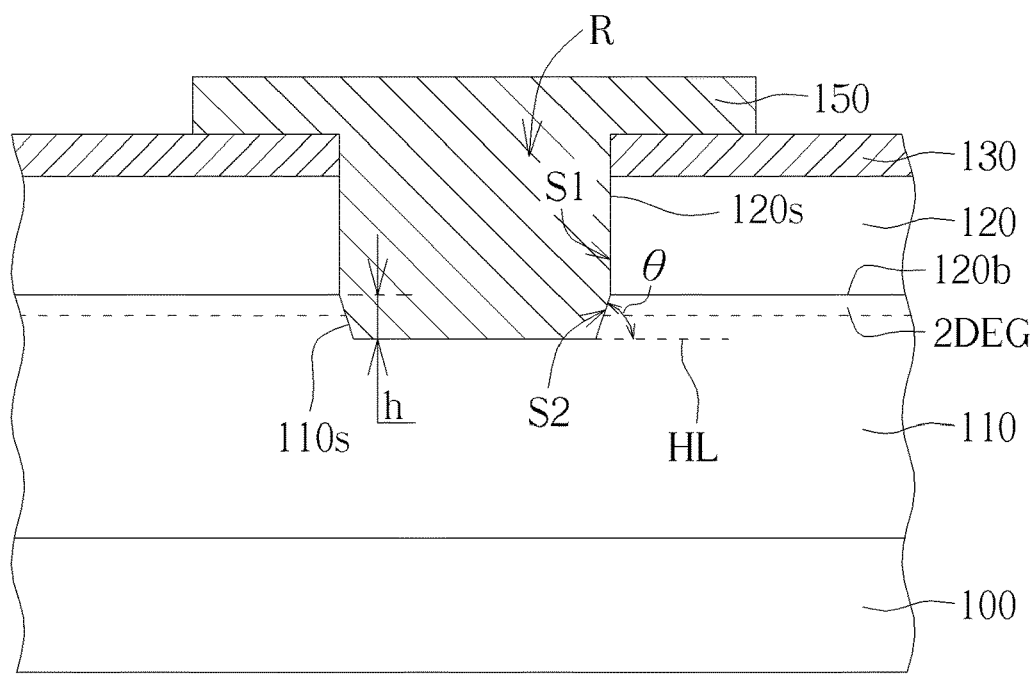

As shown in FIG. 4, an Ohmic contact metal 150 is formed in the recess R, wherein the Ohmic contact metal 150 is in direct contact with the barrier layer 120, the two-dimensional electron gas layer 2DEG and the channel layer 110 in the recess R. According to an embodiment of the present invention, the Ohmic contact metal 150 may include titanium and aluminum. According to an embodiment of the present invention, the Ohmic contact metal 150 may include titanium or aluminum, but is not limited thereto.

Figure 6:
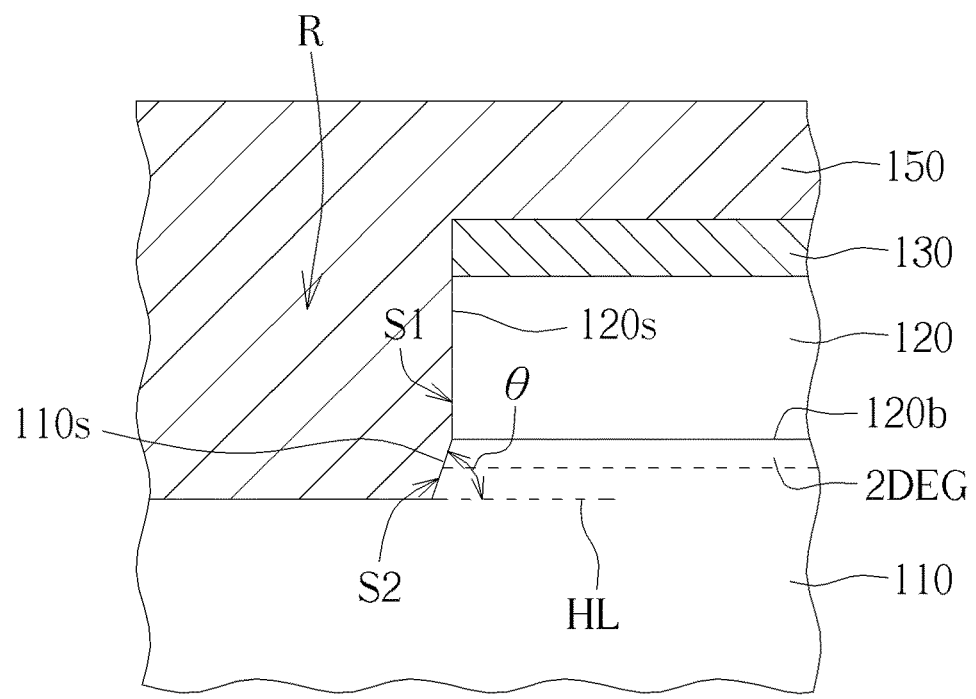
FIG. 6 illustrates that angled sidewall profile is also formed in the two-dimensional electron gas layer.

As shown in FIG. 6, according to an embodiment of the present invention, the angled sidewall profile S2 is also formed in the two-dimensional electron gas layer 2DEG.

Figure 7:
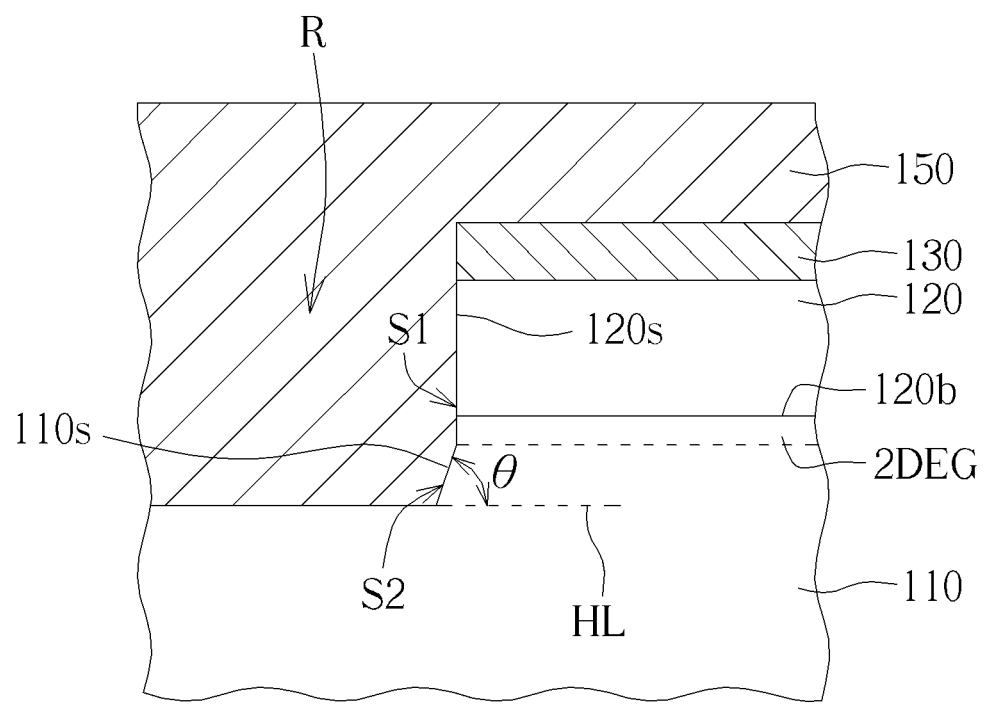
FIG. 7 illustrates that the vertical sidewall profile is also formed in the two-dimensional electron gas layer.

As shown in FIG. 7, according to another embodiment of the present invention, the vertical sidewall profile S1 is also formed in the two-dimensional electron gas layer 2DEG In this example, the Ohmic contact metal 150 is in direct contact with the vertical side surface 120s of the barrier layer 120 and the two-dimensional electron gas layer 2DEG in the recess R, and is in direct contact with the inclined side surface 110s of the channel layer 110 in the recess R.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor transistor structure with reduced contact resistance, comprising:
   a substrate;
   a channel layer on the substrate;
   a barrier layer on the channel layer;
   a two-dimensional electron gas (2DEG) layer at an interface between the barrier layer and the channel layer;
   a recess in a contact region, wherein the recess penetrates through the barrier layer and extends into the channel layer; and
   an Ohmic contact metal disposed in the recess, wherein the Ohmic contact metal is in direct contact with a vertical side surface of the barrier layer in the recess and in direct contact with an inclined side surface of the 2DEG layer and the channel layer in the recess, wherein the inclined side surface is inclined at an angle ranging between 60-80 degrees with a horizontal plane.

2. The semiconductor transistor structure with reduced contact resistance according to claim 1, wherein the channel layer comprises a GaN layer.

3. The semiconductor transistor structure with reduced contact resistance according to claim 1, wherein the barrier layer comprises an AlGaN layer.

4. The semiconductor transistor structure with reduced contact resistance according to claim 3, wherein the barrier layer further comprises an AlN layer.

5. The semiconductor transistor structure with reduced contact resistance according to claim 1 further comprising:
a passivation layer on the barrier layer.

6. The semiconductor transistor structure with reduced contact resistance according to claim 1, wherein a depth of the recess is about 10 nm below a bottom surface of the barrier layer.

7. The semiconductor transistor structure with reduced contact resistance according to claim 1, wherein the Ohmic contact metal comprises Ti and Al.

8. A semiconductor transistor structure with reduced contact resistance, comprising:
a substrate;
a channel layer on the substrate;
a barrier layer on the channel layer;
a two-dimensional electron gas (2DEG) layer at an interface between the barrier layer and the channel layer;
a recess in a contact region, wherein the recess penetrates through the barrier layer and extends into the channel layer; and
an Ohmic contact metal disposed in the recess, wherein the Ohmic contact metal is in direct contact with a vertical side surface of the barrier layer and the 2DEG layer in the recess and in direct contact with an inclined side surface of the channel layer in the recess, wherein the inclined side surface is inclined at an angle ranging between 60-80 degrees with a horizontal plane.

9. The semiconductor transistor structure with reduced contact resistance according to claim 8, wherein the channel layer comprises a GaN layer.

10. The semiconductor transistor structure with reduced contact resistance according to claim 8, wherein the barrier layer comprises an AlGaN layer.

11. The semiconductor transistor structure with reduced contact resistance according to claim 10, wherein the barrier layer further comprises an AlN layer.

12. The semiconductor transistor structure with reduced contact resistance according to claim 8 further comprising:
a passivation layer on the barrier layer.

13. The semiconductor transistor structure with reduced contact resistance according to claim 8, wherein a depth of the recess is about 10 nm below a bottom surface of the barrier layer.

14. The semiconductor transistor structure with reduced contact resistance according to claim 8, wherein the Ohmic contact metal comprises Ti and Al.

15. A method of forming a semiconductor transistor structure with reduced contact resistance, comprising:
providing a substrate;
forming a channel layer on the substrate;
forming a barrier layer on the channel layer, thereby forming a two-dimensional electron gas (2DEG) layer at an interface between the barrier layer and the channel layer;
forming a recess in a contact region, wherein the recess penetrates through the barrier layer and extends into the channel layer, wherein the recess has a vertical sidewall profile in the barrier layer and an angled sidewall profile in the channel layer, wherein the angled sidewall profile is inclined at an angle ranging between 60-80 degrees with a horizontal plane; and
forming an Ohmic contact metal in the recess, wherein the Ohmic contact metal is in direct contact with the barrier layer, the 2DEG layer and the channel layer in the recess.

16. The method according to claim 15, wherein the angled sidewall profile is also formed in the 2DEG layer.

17. The method according to claim 15, wherein the vertical sidewall profile is also formed in the 2DEG layer.

* * * * *